United States Patent
Chen et al.

(10) Patent No.: US 8,984,214 B2
(45) Date of Patent: *Mar. 17, 2015

(54) MEMORY CELL OPERATION

(71) Applicant: Micron Technology, Inc., Boise, ID (US)

(72) Inventors: Frank Chen, Shanghai (CN); Liang (Leo) Chen, Shanghai (CN)

(73) Assignee: Micron Technology, Inc., Boise, ID (US)

(*) Notice: Subject to any disclaimer, the term of this patent is extended or adjusted under 35 U.S.C. 154(b) by 50 days.

This patent is subject to a terminal disclaimer.

(21) Appl. No.: 13/827,135

(22) Filed: Mar. 14, 2013

(65) Prior Publication Data

US 2013/0198452 A1     Aug. 1, 2013

Related U.S. Application Data

(63) Continuation of application No. 13/485,226, filed on May 31, 2012, now Pat. No. 8,402,207, which is a continuation of application No. 12/388,366, filed on Feb. 18, 2009, now Pat. No. 8,195,899.

(30) Foreign Application Priority Data

Sep. 26, 2008    (CN) .......................... 2008 1 0211462
Sep. 30, 2008    (TW) .............................. 97137512 A

(51) Int. Cl.
*G06F 12/00*      (2006.01)
*G06F 3/06*      (2006.01)
*G11C 16/34*      (2006.01)

(52) U.S. Cl.
CPC ............ *G06F 3/0688* (2013.01); *G11C 16/349* (2013.01); *G11C 16/3495* (2013.01); *G06F 3/0604* (2013.01)
USPC .......................................... 711/103; 711/156

(58) Field of Classification Search
None
See application file for complete search history.

(56) References Cited

U.S. PATENT DOCUMENTS

| | | | |
|---|---|---|---|
| 7,657,701 | B2 | 2/2010 | Shanmuganathan |
| 8,402,207 | B2 * | 3/2013 | Chen et al. ..................... 711/103 |
| 2003/0021151 | A1 | 1/2003 | Katayama |
| 2003/0076710 | A1 * | 4/2003 | Sofer et al. ............... 365/185.22 |
| 2008/0147998 | A1 | 6/2008 | Jeong |
| 2008/0162786 | A1 | 7/2008 | Shanmuganathan |

OTHER PUBLICATIONS

Yamada, et al., "Degradation Mechanism of Flash EEPROM Programming after Program/Erase Cycles," IEEE IEDM Tech. Dig., Dec. 1993, pp. 23-26.
Taiwan Office Action for related TW Application No. 097137912, mailed Jul. 26, 2012, (4 pages).
Chinese Office Action for related CN Application No. 200810211462.2, Issued May 2, 2012, (8 pgs.).

* cited by examiner

*Primary Examiner* — Shawn X Gu
(74) *Attorney, Agent, or Firm* — Brooks, Cameron & Huebsch, PLLC

(57) ABSTRACT

The present disclosure includes memory devices and systems having memory cells, as well as methods for operating the memory cells. One or more methods for operating memory cells includes determining age information for a portion of the memory cells and communicating a command set for the portion of the memory cells, the command set including the age information.

20 Claims, 6 Drawing Sheets

| Cycle | I/O7 | I/O6 | I/O5 | I/O4 | I/O3 | I/O2 | I/O1 | I/O0 |
|---|---|---|---|---|---|---|---|---|
| First | CA7 | CA6 | CA5 | CA4 | CA3 | CA2 | CA1 | CA0 |
| Second | LOW | LOW | LOW | CA12 | CA11 | CA10 | CA9 | CA8 |
| Third | BA7 | BA6 | BA5 | PA4 | PA3 | PA2 | PA1 | PA0 |
| Fourth | BA15 | BA14 | BA13 | BA12 | BA11 | BA10 | BA9 | BA8 |
| Fifth | Age2 | Age1 | Age0 | LOW | LOW | LOW | BA17 | BA16 |

USE UPPER 3 UN-USED BITS AS AGE BIT

*Fig. 5A*

| Cycle | I/O7 | I/O6 | I/O5 | I/O4 | I/O3 | I/O2 | I/O1 | I/O0 |
|---|---|---|---|---|---|---|---|---|
| First | CA7 | CA6 | CA5 | CA4 | CA3 | CA2 | CA1 | CA0 |
| Second | LOW | LOW | LOW | CA12 | CA11 | CA10 | CA9 | CA8 |
| Third | BA7 | BA6 | BA5 | PA4 | PA3 | PA2 | PA1 | PA0 |
| Fourth | BA15 | BA14 | BA13 | BA12 | BA11 | BA10 | BA9 | BA8 |
| Fifth | LOW | LOW | LOW | LOW | LOW | LOW | BA17 | BA16 |
| Sixth | Age3 | Age2 | Age1 | Age0 | LOW | LOW | LOW | LOW |

ADDITIONAL ADDRESS CYCLE

SEND M3B [3:0] OF BLOCK AGE TO NAND

MEMORY CELL OPERATION

PRIORITY INFORMATION

This application is a Continuation of, and claims priority to, U.S. application Ser. No. 13/485,226, filed May 31, 2012, to be issued as U.S. Pat. No. 8,402,207 on Mar. 19, 2013, which is a Continuation of, and claims priority to, U.S. application Ser. No. 12/388,366, filed Feb. 18, 2009, issued as U.S. Pat. No. 8,195,899 on Jun. 5, 2012, which claims priority to a China Patent Application Serial No. 200810211462.2, filed Sep. 26, 2008, and a Taiwan Patent Application Serial No. 097137512, filed Sep. 30, 2008, the specifications of which are hereby incorporated by reference.

TECHNICAL FIELD

The present disclosure relates to semiconductors and semiconductor memory devices. More particularly, in one or more embodiments the present disclosure relates to operating a memory device.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers such as a portable memory stick and a solid state drive (SSD), personal digital assistants (PDAs), digital cameras, and cellular telephones, portable music players (e.g., MP3 players), and movie players, among others. Program code and system data, such as a basic input/output system (BIOS), are typically stored in flash memory devices. This information can be used in personal computer systems, and other electronic devices.

Two common types of flash memory array architectures are the "NAND" and "NOR" architectures, so called for the logical form in which the basic memory cell configuration of each is arranged. The floating gate memory cells of the memory array are typically arranged in a matrix. The gates of each floating gate memory cell in a "row" of the array are coupled to an access line (one example which is a "word line"). In a NOR architecture, the drains of each memory cell in a "column" of the array are coupled to a data line (one example which is a "bit line"). In a NAND architecture, the drain of individual memory cells is not directly coupled to a bit line. Instead, the memory cells of the array are coupled together in series, source to drain, between a source line and a bit line.

The NOR architecture floating gate memory array is accessed through a row decoder activating a row of floating gate memory cells by selecting the word line coupled to their gates. The row of selected memory cells then place their data values on the bit lines by causing different currents to flow depending on the state to which a particular cell is programmed.

The NAND architecture memory array is also accessed through a row decoder activating a row of memory cells by selecting the word line coupled to their gates. A high bias voltage is applied to a select gate drain line SG(D). In addition, the word lines coupled to the gates of the unselected memory cells of each group are driven (e.g., at Vpass) to operate the unselected memory cells of each group as pass transistors so that they pass current in a manner that is unrestricted by their stored data values. Current then flows from the source line to the column bit line through each series coupled group, restricted only by the selected memory cells of each group. This places the current encoded data values of the row of selected memory cells on the bit lines.

Memory cells can be programmed to an intended state. That is, electric charge can be placed on or removed from the floating gate of a memory cell to put the cell into a number of programmed states. For example, a single level cell (SLC) can represent one of two programmed states (e.g., 1 or 0). The memory cell is commonly referred to as being "erased" when representing the programmed state corresponding to charge being removed from the floating gate.

Flash memory cells can also represent one of more than two programmed states, such as to represent more than two binary digits (e.g., 1111, 0111, 0011, 1011, 1001, 0001, 0101, 1101, 1100, 0100, 0000, 1000, 1010, 0010, 0110, and 1110). Such cells may be referred to as multi state memory cells, multi-digit cells, or multilevel cells (MLCs). MLCs can allow the manufacture of higher density memories without increasing the number of memory cells since each cell can represent more than one binary digit (e.g., more than one bit). MLCs can, in some embodiments, each represent one of more than two programmed states (e.g., a cell capable of representing four digits can be put into sixteen programmed states). For some MLCs, one of the sixteen programmed states can be an erased state, while the other states are programmed states.

BRIEF DESCRIPTION OF THE DRAWINGS

FIG. 5A is a table illustrating an address data arrangement organized into 5 cycles in accordance with one or more embodiments of the present disclosure.

FIG. 5B is a table illustrating an address data arrangement organized into 6 cycles in accordance with one or more embodiments of the present disclosure.

DETAILED DESCRIPTION

Figure 1:
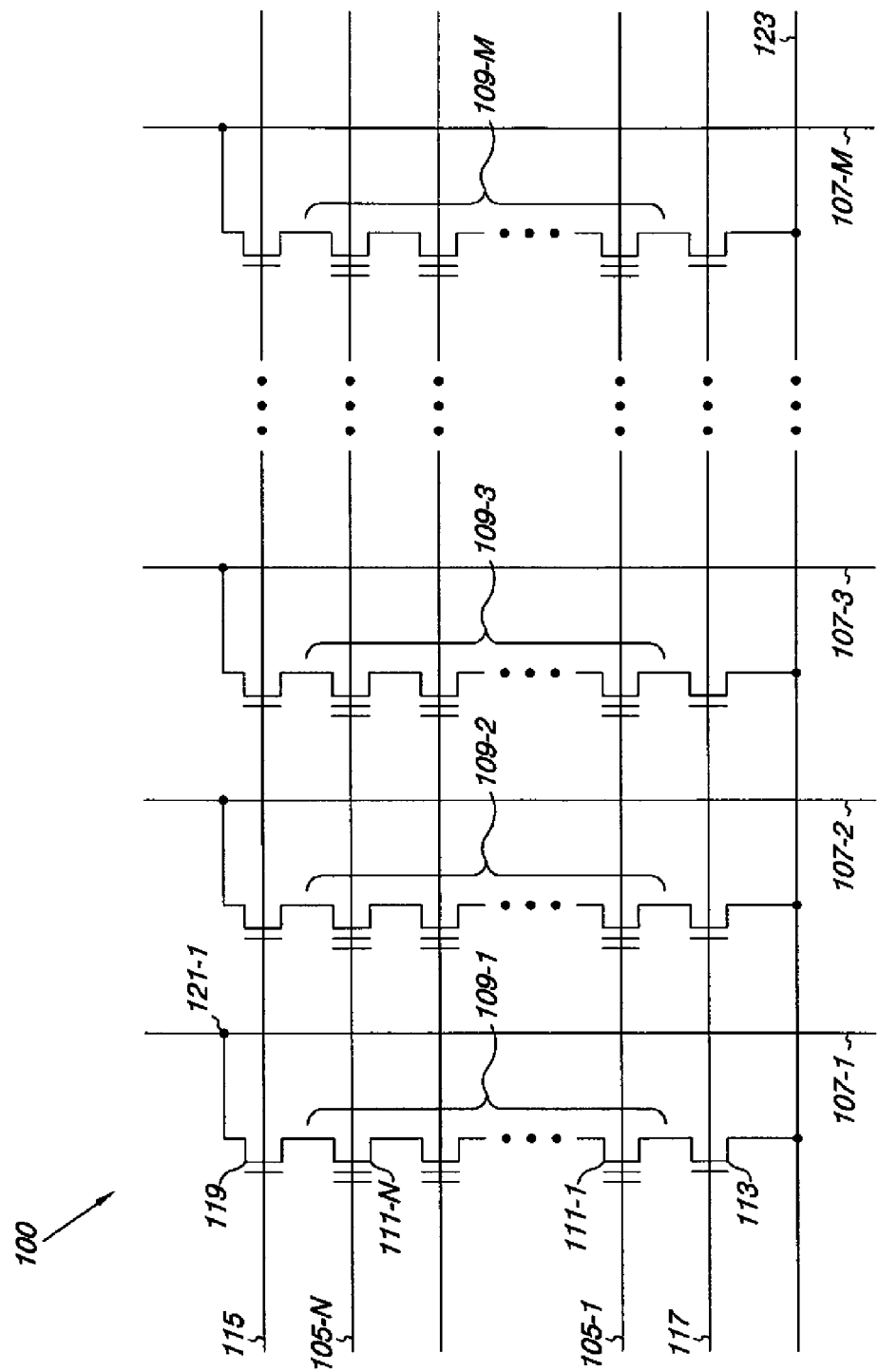
FIG. 1 is a schematic of a portion of a non-volatile memory array in accordance with one or more embodiments of the present disclosure.

The present disclosure includes memory devices and systems having memory cells, as well as methods for operating the memory cells. One or more methods for operating memory cells includes determining age information for a portion of the memory cells and communicating a command set for the portion of the memory cells, the command set including the age information.

In the following detailed description of the present disclosure, reference is made to the accompanying drawings that form a part hereof, and in which is shown by way of illustration how one or more embodiments of the present disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the extent of the present disclosure.

The figures herein follow a numbering convention in which the first digit or digits correspond to the drawing figure number and the remaining digits identify an element or component in the drawing. Similar elements or components between different figures may be identified by the use of similar digits. For example, 220 may reference element "20" in FIG. 2, and a similar element may be referenced as 320 in FIG. 3.

As used herein, the designators "N" and "M," particularly with respect to reference numerals in the drawings, indicate that a number of the particular feature so designated can be included with one or more embodiments of the present disclosure. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

In a binary system, a "bit" often represents one unit of data. Although the term bit is used herein, embodiments of the present disclosure are not limited to a binary system. One skilled in the art will appreciate that embodiments of the present disclosure may be implemented in other multi-state systems, and that "bit" as used herein may be interpreted as the smallest "unit" of data or data element (e.g., of a word of data communicated across a communication interface).

The quantity of program/erase cycles performed on a number of memory cells is referred to herein as "wear cycles." Wear cycles are also known as "process cycles," an "experience count," or "hot count." Wear cycle information refers to a representation of a particular quantity of program/erase operations. Wear cycle information may be a number, or other encoded value.

As used herein, "wear state" denotes a classification encompassing one or more wear cycles. A wear state may indicate one of several relative operating conditions (e.g., "young," "old") and may be represented by a status flag having a value of 1 or 0, with the boundary between two wear states being some quantity of wear cycles (e.g., 100,000). A wear state may be a wear cycle quantity (e.g., each wear cycle value defines a particular wear state) or a wear state may include a range of wear cycles (e.g., from 1 to 1000 is a first wear state, from 1001 to 10,000 is a second wear state). According to one embodiment of the present invention, the useful life of a memory device may be classified into a number of wear states, for example, sixteen wear states. However, embodiments are not limited to any particular quantity of wear states.

A wear state may refer to a classification with respect to future operations (e.g., a state enabling high reliability or a state enabling high speed operations) where a particular state tends to cause the memory cells to expend useful life at a different rate. Thus, wear state may define a set of operating characteristics, or properties, corresponding to a rate at which memory cells may wear out when operated in the particular wear state. Used in this manner, wear state is similar to an operating mode that impacts how memory cells will consume useful life. Additionally, a wear state may be a classification, referring to an amount of useful life of a memory cell already expended. A wear state may also refer to a classification with respect to past operations (e.g., a quantity or range of wear cycles to which memory cells have already been operated).

Thus, wear cycles and wear state may represent an "age" of the memory cells (e.g., a percentage of useful life, amount of useful life) already used up. The term "age" can refer to memory cell useful life, rather than a chronological measurement. Useful life can refer to a fraction of expected reliable operations of one or more memory cells. Thus, age can refer to an accumulation, or use, of a certain number of memory cell wear cycles, or a certain portion of expected reliable operations. Wear state information refers to a representation of a particular wear state.

Operating a memory cell, as used herein, includes reading from, writing to, or erasing the memory cell. The operation of placing a memory cell in an intended state is referred to herein as "programming," and includes both writing and erasing the memory cell (i.e., the memory cell may be programmed to an erased state).

According to one or more embodiments of the present disclosure, a memory access device (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, and/or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each read and program (e.g., write, erase) operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

For example, the memory device may be programmed with a Vt drift curve as a function of wear cycles. Control circuitry (e.g., control logic) on the memory device may be configured to determine one or more memory cell operating parameters in response to receipt of the wear cycle information. Examples of operating parameters which may be determined include a programming pulse voltage magnitude, a programming pulse duration, a programming pulse frequency, and the quantity of programming pulses, among others.

According to one or more embodiments of the present disclosure, a memory access device may be configured to provide wear state information to the memory device with each read, program, and/or erase operation. The memory device control circuitry (e.g., control logic) may be programmed to compensate for memory device performance changes corresponding to the wear state information. The memory device may receive the wear state information and determine one or more operating parameters (e.g., a value or characteristic thereof) in response to the wear state information.

Similar to the description above with respect to determining one or more operating parameters in response to wear cycle information, the memory device may be programmed with a Vt drift curve as a function of wear state. Control circuitry (e.g., control logic) on the memory device may be configured to determine one or more memory cell operating parameters in response to receipt of the wear state information. Examples of operating parameters which may be determined in response to wear state information are as set forth above in response to wear cycle information.

Memory cells, such as SLCs and MLCs, store one or more units of data on each cell by using different threshold voltage (Vt) levels, each representing one of a number of programmed states. The difference between adjacent Vt levels may be very small for a MLC memory device as compared to a SLC memory device. The reduced margins between adjacent Vt levels (e.g., representing different programmed states) can increase the difficulty associated with distinguishing between adjacent programmed states, which can lead to problems such as reduced data read and/or data retrieval reliability.

In a NAND array architecture, the state of a selected memory cell is determined by sensing a current or voltage variation associated with a particular bit line to which the selected cell is coupled. Since the memory cells in a NAND array architecture are connected in series, the current associated with reading the selected cell passes through several other unselected cells (e.g., cells biased so as to be in a conductive state) coupled to the bit line. Various degradation mechanisms exist which can result in erroneous data reads of non-volatile memory cells. The cell current associated with a string of memory cells (e.g., cells coupled in series between a source line and a sense line) can become degraded over time. Memory cells affected by current degradation mechanisms can become unreliable (e.g., the logical value read from the cells may not necessarily be the logical value written to the cells).

Program/erase cycling is one factor which can affect memory cell performance. Several mechanisms are known which affect performance of charge storage (e.g., floating gate) type devices over time and use. For example, trapped charge can gradually accumulate between adjacent memory cells, resulting in Vt drift. Other types of memory cells may be affected by other degradation mechanisms that occur with use (e.g., wear cycling).

The useful life of a memory cell (which is often referred to as endurance) is dependent on the difference in a cell's threshold voltage, Vt, between programmed states, including where one of the programmed states represents the memory cell being erased. As the number of program/erase cycles (i.e., wear cycles) increases, cell current can decrease in some memory cells, resulting in subsequent data read errors. Increasing program/erase cycling is also associated with changes in memory programming performance. For example, programming speed may increase, and erase speed may decrease. Other changes in operational attributes may also occur. Faster programming speed may make the affected cells more susceptible to over-programming. For instance, when a voltage is applied to a particular cell, the conditioning of the cell may cause the cell to be over charged, thereby causing further cell degradation and an incorrect result when read and/or verified.

Memory devices can be programmed with various amounts of data at one time. A number of memory cells of a memory device may be programmed at one time, for example a page of data. A number of memory cells of a memory device may be erased at the same time, for example a block of data. A block of data can include a number of data pages. A memory plane can include a number of data blocks on a given die. Some memory devices have multiple planes per die.

While memory cells may be programmed individually or by page, memory cells are generally erased in groups, such as in blocks or other functional groups, as will be appreciated by those possessing ordinary skill in the art. A block of memory cells may be erased by setting the erase voltage parameters (e.g., Verase magnitude) and issuing a quantity of erase pulses having certain erase voltage parameters (e.g., quantity, duration, magnitude changes from one pulse to another, etc.) Subsequent to an erase attempt operation, a erase verification may be performed to determine if the group of memory cells has been satisfactorily erased. If not, additional erase pulses may be issued, with periodic erase verification being performed until satisfactory erasure is accomplished with respect to a particular threshold voltage (Vt).

The threshold voltage of the memory cells comprising a non-volatile memory device (e.g., a NAND flash device) can shift as the quantity of wear cycles increases. Eventually, Vt can drift out of a boundary initially defining a given state (e.g., logical 1 or 0) such that the state can no longer be reliably ascertained. When reliability in accurately determining memory cell state for a block of memory cells degrades beyond limits, the block may be considered worn out, and may be excluded from further use (e.g., "retired").

A memory device may not be age aware. That is, the memory device itself may not track wear cycles, and thus may not recognize for example, that the Vt of certain memory cells, or groups of memory cells, are drifting as the block ages (e.g., as the quantity of wear cycles for that block of memory cells increases). Therefore, the memory device may not account for, or operate to accommodate, the Vt drift of certain memory cells, or groups of memory cells (e.g., blocks).

According to one or more embodiments of the present disclosure, the wear cycles associated with a memory device, and/or with a number of memory cells (e.g., block) within the memory device, can be monitored, and information corresponding to the age (e.g., wear cycle information, wear state information) of a particular portion of memory can be communicated to the memory device.

For example, wear cycles can be monitored by firmware implemented in a memory access device, or by logic instructions executed by the memory access device. Wear cycle information can be communicated to the memory device when operating those particular memory cells. While a NAND architecture flash array device is illustrated and discussed, embodiments of the present disclosure are not so limited, and one of ordinary skill in the art will appreciate that embodiments may be implemented using other memory device architectures, types, arrangements, and configurations.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes access lines (e.g., "word lines") 105-1, . . . , 105-N, and intersecting data lines (e.g., "bit lines") 107-1, . . . , 107-M. For ease of addressing in the digital environment, the number of word lines 105-1, . . . , 105-N and the number of bit lines 107-1, . . . , 107-M are typically each some power of two (e.g., 256 word lines by 4,096 bit lines).

Memory array 100 includes NAND strings 109-1, . . . , 109-M. Each NAND string includes non-volatile memory cells 111-1, . . . , 111-N, each located at an intersection of a word line (e.g., 105-1, . . . , 105-N) and a local bit line (e.g., 107-1, . . . , 107-M). The non-volatile memory cells 111-1, ..., 111-N of each NAND string 109-1, ..., 109-M are connected in series source to drain between a source select gate (SGS) (e.g., a field-effect transistor (FET) 113) and a drain select gate (SGD) (e.g., FET 119). Source select gate 113 is located at the intersection of a local bit line 107-1 and a source select line 117. The drain select gate 119 is located at the intersection of the local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N (e.g., a floating-gate transistor, of the corresponding NAND string 109-1).

In one or more embodiments, construction of non-volatile memory cells, 111-1, ..., 111-N, includes a source, a drain, a floating gate or other charge storage node, and a control gate. Non-volatile memory cells, 111-1, ..., 111-N, have their control gates coupled to a word line, 105-1, ..., 105-N respectively. A column of the non-volatile memory cells, 111-1, ..., 111-N, make up the NAND strings (e.g., 109-1, ..., 109-M) those memory cells being commonly coupled to a given local bit line (e.g., 107-1, ..., 107-M respectively). A row of the non-volatile memory cells are those memory cells commonly coupled to a given word line (e.g., 105-1, ..., 105-N). A NOR array architecture would be similarly laid out except that the string of memory cells would be coupled in parallel between the select gates.

As one of ordinary skill in the art will appreciate, subsets of cells coupled to a selected word line (e.g., 105-1, ..., 105-N) can be programmed and/or sensed together as a group. A programming operation, such as a write operation, can include applying a number of program pulses (e.g., 16V-20V) to a selected word line in order to increase the threshold voltage (Vt) of selected cells to a particular program voltage level corresponding to an intended program state. Memory cells may be erased by programming to an erased state (e.g., to a erased programming voltage level).

A sensing operation, such as a read or program verify operation, can include sensing a voltage and/or current change of a bit line coupled to a selected cell in order to determine the state of the selected cell. The sensing operation can involve biasing a bit line (e.g., bit line 107-1) associated with a selected memory cell at a voltage above a bias voltage for a source line (e.g., source line 123) associated with the selected memory cell. A sensing operation could alternatively include pre-charging the bit line 107-1 followed with discharge when a selected cell begins to conduct, and sensing the discharge.

Sensing the state of a selected cell can include applying a sensing voltage to a selected word line, while biasing the unselected cells of the string at a voltage sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the state of a selected cell can be determined by the word line voltage at which the bit line current reaches a predetermined reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, the interpreted value of data stored in the selected cell can be based on whether the bit line current changes by a predetermined amount or reaches a predetermined level in a given time period.

When the selected cell is in a conductive state, current flows between a source line contact at one end of the string, and a bit line contact at the other end of the string. As such, the current associated with sensing the selected cell is carried through each of the other cells in the string, the diffused regions between cell stacks, and the select transistors.

Figure 2:
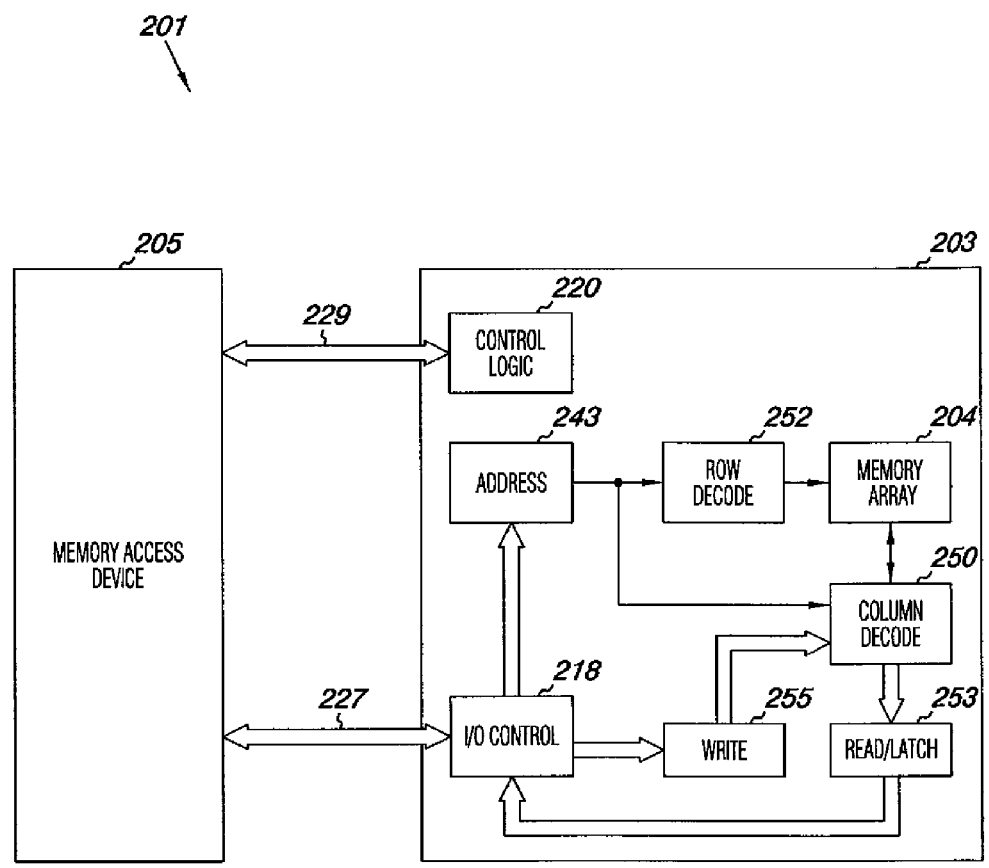
FIG. 2 is a functional block diagram of an electronic system having at least one memory device operated in accordance with one or more embodiments of the present disclosure.

FIG. 2 is a functional block diagram of an electronic system 201 (e.g., memory system) having at least one memory device 203 operated in accordance with one or more embodiments of the present disclosure. Memory system 201 includes a memory access device 205 (e.g., processor, firmware, etc.) coupled to the memory device 203. According to one or more embodiments of the present disclosure, the memory device 203 is a non-volatile floating gate memory device such a NAND flash device.

The non-volatile memory device 203 includes a memory array 204 of non-volatile memory cells. The non-volatile memory device 203 and memory access device 205, can be implemented as separate integrated circuits, or the processor 205 and the memory device 203 can be incorporated into the same integrated circuit, chip, or package. The memory access device 205 can be a discrete device (e.g., microprocessor) or some other type of process circuitry implemented in firmware, such as an application-specific integrated circuit (ASIC).

I/O connections 227 and control connections 229 comprise a communication interface between the memory access device 205 and the memory device 203. The embodiment of FIG. 2 includes address circuitry 243 to latch address signals provided over the I/O connections 227 through I/O control circuitry 218. Address signals are received and decoded by a row decoder 252 and a column decoder 250 to access the memory array 204. In light of the present disclosure, it will be appreciated by those skilled in the art that the number of address input connections depends on the density and architecture of the memory array 204 and that the number of addresses increases with both increased numbers of memory cells per memory array, an increased number of memory blocks and/or an increased number of memory arrays. The reader will also appreciate that more address information may be needed to specify a particular portion of the memory array as the size of the memory array increases.

The memory device 203 senses data in the memory array 204 by sensing voltage and/or current changes in the memory array columns using sense/buffer circuitry, shown in FIG. 2 as the read/latch circuitry 253. The read/latch circuitry 253 can read and latch a page (e.g., a row) of data from the memory array 204. I/O control circuitry 218 is included for bi-directional data communication over the I/O connections 227 with the memory access device 205. Write circuitry 255 is included to write data to the memory array 204.

Figure 4:
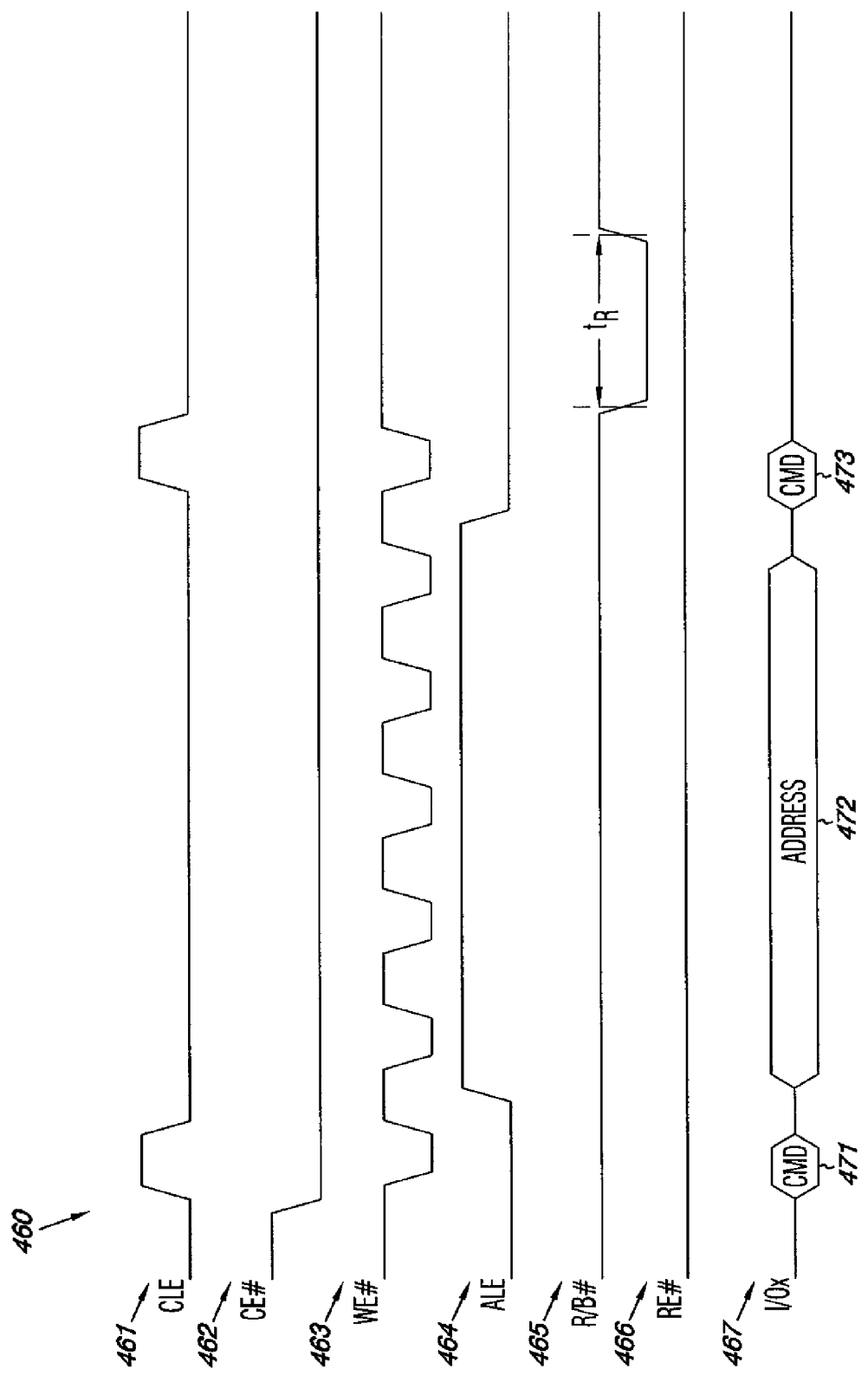
FIG. 4 shows timing waveforms associated with operating memory cells in accordance with one or more embodiments of the present disclosure.

Control logic circuitry 220 decodes signals communicated by control connections 229 from the memory access device 205, such as those illustrated in FIG. 4. These signals can include chip signals, write enable signals, and address latch signals (among others) that are used to control the operations on the memory device 203, and of the memory array 204, including data sensing (e.g., reading) and data programming (e.g., writing, erasing).

The control logic circuitry 220 can send signals (e.g., commands) to selectively set particular registers and/or sections of registers, or latch data in one or more registers. In one or more embodiments, the control logic circuitry 220 is responsible for executing instructions received from the memory access device 205 to perform certain operations on some portion of the memory cells of the memory array 204. The control logic circuitry 220 can be a state machine, a sequencer, or some other type of logic controller. It will be appreciated by those skilled in the art that additional circuitry and control signals can be communicated, and that the memory device detail of FIG. 2 has been reduced to facilitate ease of illustration.

According to one or more embodiments of the present disclosure, a memory access device 205 (e.g., processor, firmware) shown in FIG. 2 being external to the memory device 203, determines (e.g., tracks, counts, records) a number of wear cycles performed on particular groups of memory cells within the memory array 204. For example, the memory access device 205 may determine wear cycles for each block of memory cells in memory array 204. After a quantity of wear cycles is determined for a portion of a memory device (e.g., a block) the memory access device may determine a wear state for the portion of the memory device 203, and communicate the wear state (as wear state information) to the memory device 203 as part of access information to operate that portion of the memory device 203.

Wear state may be determined by a number of techniques. Wear cycles may be determined by the memory access device 205 each time one or more operations of a wear cycle occurs involving a portion of the memory device 203. For example, a counter may be incremented each time a block of memory cells is programmed (e.g., written to, erased). Firmware may be used to count or track wear cycle/state, the firmware being located within the memory access device 205 and in communication with a processor of the memory access device.

Operational performance of some portion of the memory device 203 can also be measured by the memory access device 205, and age information determined from the measured performance. For example, a data arrangement (e.g., table, function) may be determined by testing of a similarly-manufactured memory device, and may include measured operating performance characteristics related to age (e.g., a range of wear cycles, a wear state). According to one specific example, the age information of a memory device may be determined by measuring the quantity of erase pulses needed to accomplish a verified erasure, where prior testing indicated that quantity of erase pulses needed increases with memory device wear cycles.

As previously discussed, threshold voltage, Vt, drifts as the quantity of wear cycles for a memory cell increase. Thus, Vt drift may be experimentally determined for memory cells as a function of memory cell age (e.g., wear cycles, wear state), and a Vt drift curve developed. The Vt drift curve may then be used to characterize the performance of similar memory cells. For example, predetermined Vt drift curve information may be stored in a portion of a memory device as a data arrangement (e.g., lookup table, computation, etc.). Given the memory cell age (e.g., wear cycle information, wear state information) operating parameters may be determined to accommodate the expected Vt drift, or to achieve some other operational performance in view of the expected Vt drift. According to one or more embodiments, operating parameters may be determined to minimize the expected Vt drift for a particular age of memory cells.

A data arrangement characterizing the operating performance of the memory device 203, and relating at least one operating parameter to age information (e.g., wear cycle information, wear state information), may be stored in the memory device 203 itself, or programmed into firmware (e.g., control logic circuitry 220) on the memory device. Upon receiving age information from the memory access device 205 (e.g., wear cycle information, wear state information) control logic 220 may determine at least one operating parameter for one or more memory cells being operated on the memory device 203 (e.g., by selecting a value of at least one operating parameter, by selecting a change to a value of at least one operating parameter, by computing a value of at least one operating parameter, by computing a change to a value of at least one operating parameter) from the data arrangement stored in the memory device 203.

Figure 3:
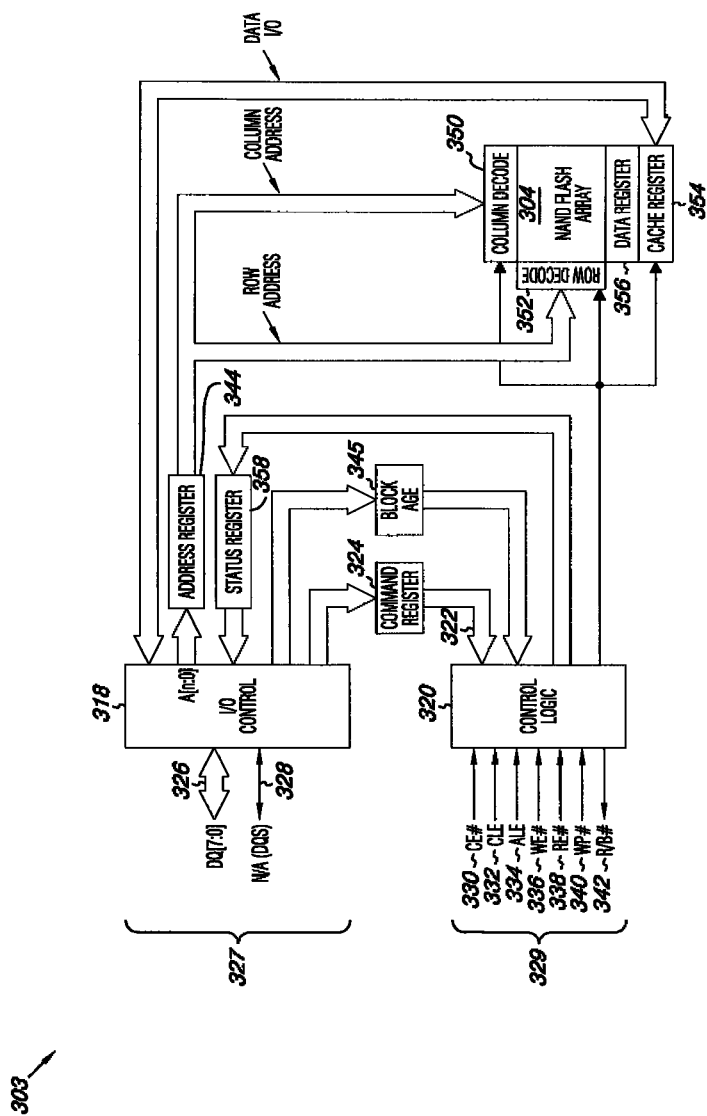
FIG. 3 is a functional block diagram of a memory device in accordance with one or more embodiments of the present disclosure.

FIG. 3 is a functional block diagram of a memory device 303 in accordance with one or more embodiments of the present disclosure. In the embodiment shown in FIG. 3, the memory device 303 includes a memory 304 (e.g., NAND flash array) and may include other control circuitry such as I/O control 318 and control logic 320. While memory 304 is shown being a NAND flash array, embodiments of the present disclosure are not so limited, and may include other types of memory, as well different memory arrangements and/or internal divisions (e.g., planes, blocks, pages, etc.)

I/O connections 327 and control connections 329 comprise a communication interface between a memory access device (e.g., 205 in FIG. 2) and the memory device 303. According to one or more embodiments, memory device 303 may be configured (e.g., with pins, pads, contacts, etc.) to receive combined or separate data, command, and address signal lines However, data, commands, and addresses may all be multiplexed onto common signal paths (e.g., as shown in FIG. 3 at 326) and received by I/O control 318.

Addresses received by I/O control 318 may be latched by an address register 344 and communicated to a row decoder 352 to select a row address, and/or to a column decoder 350 to select a column address, of the NAND flash memory array 304. Data may be transferred to or from the NAND flash memory array 304, byte by byte, for example through a cache register 354 and data register 356. The cache register 354 is nearest to I/O control 318, and acts as a data buffer for I/O data. The data register 356 is nearest to the memory array 304, and acts as a data buffer for the memory array 304.

Row and column addresses are communicated by the address register (e.g., buffer) 344 for decoding by a row address decoder 352 and a column address decoder 350, respectively. Memory array I/O control 318 is coupled to the memory array (e.g., 304) via an I/O data bus. Write data are applied to the memory array 304 through a data input buffer (e.g., cache register 354) and the memory array read/write circuitry (e.g., data register 356).

I/O control 318 generates internal control signals within the memory device 303 to carry out various memory operations. The control signals may be coded digital values (e.g., binary codes, hexadecimal codes, etc.) For example, a register bit (e.g., flag) may be used to indicate status of a control signal, or a hexadecimal code may be communicated over an I/O path to indicate a particular command of an instruction set.

Commands received by I/O control 318 may be latched by a command register 324 and transferred to control logic 320 for generating internal signals to control memory device operations. Age information (e.g., wear cycle information, wear state information) may be latched by a block age register 345 and transferred to control logic 320 for generating the internal signals to control memory device operations. Control logic 320 receives latched memory commands (e.g., through signal lines and/or a command bus 322). For example, control logic 320 may receive various signals such as a status bit (e.g., flag) set in a command register 324. Control logic 320 similarly receives latched age information through signal lines, a data bus, as status bits or flags, as will be understood by those with ordinary skill in the art.

The control logic 320 responds to memory commands and block age information applied through the command register 324 and block age register 345 respectively, to perform various operations on the memory array 304. According to one or more embodiments, control logic 320 determines one or more operating parameters based on the block age information to perform various operations on the memory array 304.

In a read operation, the data read from the memory array 304 is transferred to the output buffer (e.g., data register 356) and communicated on the data I/O lines. In a write operation, the addressed memory cell is accessed and data is communicated on the data I/O lines to the data input buffer (e.g., data register 356 through the cache register 354) to be stored in the memory array 304.

According to one or more embodiments of the present disclosure, and as shown in FIG. 3, memory 304 is a high speed NAND Flash array device. The communication interface (e.g., 329 and 327) between a memory access device (e.g., 205 in FIG. 2) and memory 304 can be operated in a synchronous mode to achieve faster I/O operations, or in an asynchronous mode for compatibility with slower NAND Flash devices. The communication interface may use a highly multiplexed 8-bit bus 326 (DQ[7:0]) to transfer commands, addresses, and data. Data transfers in the synchronous mode include a bidirectional data strobe (DQS) 328.

According to one or more embodiments, between the synchronous and asynchronous modes, a number of signals are used to implement a NAND Flash protocol. In the asynchronous mode, these signals include a chip enable (CE#) signal on a CE# signal line 330, command latch enable (CLE) signal on a CLE signal line 332, address latch enable (ALE) signal on a ALE signal line 334, write enable (WE#) signal on a WE# signal line 336, and read enable (RE#) signal on a RE# signal line 338. Additional signals control hardware write protection (e.g., the write protection (WP#) signal on the WP# signal line 340) and monitor device status (e.g., the ready/busy (R/B#) signal on the R/B# signal line 342). As one of ordinary skill in the art will appreciate, the "#" symbol indicates a particular signal being active in a LOW logic state.

The CE# signal enables or disables one or more logical units (e.g., an 8 Gb block of memory 304) when the communication interface is operating in asynchronous mode. The CLE signal is used to load a command from the bus 326 (DQ[7:0]) into the command register 324. The ALE signal is used to load an address from the bus 326 (DQ[7:0]) into an address register 344. The WE# signal transfers commands, addresses, and serial data from a memory access device (e.g., processor) memory controller, control circuitry, host system, etc., to the memory 304 when the communication interface is operating in asynchronous mode. The RE# signal transfers serial data from the memory 304 to a host system when the communication interface is operating in asynchronous mode. The WP# signal enables or disables memory 304 programming and erase operations when the communication interface is operating in asynchronous mode. These signals are discussed further in reference to FIG. 4.

FIG. 4 shows timing waveforms associated with operating memory cells, in accordance with one or more embodiments of the present disclosure. Various control signals coordinate communication of a command, address and other information, and data across a memory interface. In accessing one or more memory cells, a memory access device communicates accessing information that includes control signals and a command set. In general terms, a command set includes a command to be accomplished, an address in memory, and the data associated with the memory location and/or command.

A write command set can include communicating, on a multiplexed bus, an initial command, followed by address information, and then by the data. In an asynchronous mode, the command, address information, and data may be latched on the rising edge of the WE# signal, for example. A read command set can include communicating, on the multiplexed bus, an initial command, followed by address information, and then by the read-out data. By way of example, the waveforms shown in FIG. 4 are associated with a write operation, communicated in an asynchronous mode.

Communicating a command set includes communicating at least one command cycle and at least one address cycle. According to one or more embodiments of the present disclosure, communicating the command set includes transmitting at least one command cycle that includes wear cycle information and/or wear state information. According to one or more embodiments of the present disclosure, communicating the command set includes transmitting at least one address cycle that includes wear cycle and/or state information.

As will be appreciated by one having ordinary skill in the art, certain signal lines may be used for asynchronous data transfer. Additional or other signals and/or signal lines may be used for synchronous data transfer. Embodiments of the present disclosure are not limited to the asynchronous communication implementation described below and shown in FIG. 4. Signals associated with an asynchronous communication technique are used for illustration of one implementation method. One skilled in the art will appreciate how the present disclosure may be implemented using other communication techniques (e.g., synchronous, etc.)

According to one or more embodiments, a number of signals are used to implement a NAND flash communication protocol 460, as previously described. In the asynchronous mode and as shown in FIG. 4, these signals include a CLE signal 461, a CE# signal 462, a WE signal 463, an ALE signal 464, and a RE# signal 466. One or more additional signals control hardware write protection (WP#—not shown), and monitor device status (e.g., a ready/busy (R/B#) signal 465). As one skilled in the art will appreciate, the "#" symbol indicates a particular signal being active in a LOW logic state.

When the communication between a memory device (e.g., 203 in FIG. 2) and a memory access device (e.g., 205 in FIG. 2) is asynchronous, the memory device (e.g., 203 in FIG. 2) is not driven by an external clock. The WE# signal 463 is used to provide a timing reference to the memory device (e.g., 203 in FIG. 2). Timing chains that are activated by the control signals (e.g., ALE 464 and CLE 461) are used to control the timing of the communications transfer. The memory access device (e.g., 205 in FIG. 2) uses control signals to indicate to the memory device (e.g., 303 in FIG. 3) when requests for data transactions are sent, and the data transfers are performed asynchronously.

Referring to the circuit shown in FIG. 3, as well as the waveforms shown in FIG. 4, the CE# signal 462 is active LOW and enables or disables one or more logical units (e.g., a block) of memory 304 when a communication interface is operating in asynchronous mode. The CLE signal 461 is active HIGH and used to load a command from the bus 326 (DQ[7:0]) into the command register 324. Information on bus 326 is represented in FIG. 4 by the waveform labeled I/Ox 467. The ALE signal 464 is active HIGH and used to load an address from the bus 326 (DQ[7:0]) into an address register 344, and wear cycle information from the bus 326 (DQ[7:0]) into a block age register 345. The WE# signal 463 transfers commands, addresses and other information, and serial data from a memory access device (e.g., processor 205 shown in FIG. 2, firmware, memory controller, control circuitry, host system, etc.) to the memory 304 when communication interface is operating in asynchronous mode.

The RE# signal 466 is active LOW and signals transfer of serial data from the memory 304 to the host system. Note that in FIG. 4, the RE# signal 466 is shown HIGH (i.e., not active, since the signal is active LOW), as the waveforms shown in FIG. 4 are associated with a write operation.

A write command set is used to write data to the memory device. The write command 471 is communicated on the bus (e.g., I/Ox 467 in FIG. 4) during an initial command cycle, with the CLE signal 461 being in a HIGH logic state corresponding to a rising edge of the WE# signal 463. According to one or more embodiments of the present disclosure, other information, such as wear cycle and/or wear state information, may be communicated on the bus (e.g., I/Ox 667 in FIG. 4) during the command cycles 471.

Address and age information (e.g., wear cycle information, wear state information) may be communicated on the bus (e.g., I/Ox 667 in FIG. 4) during the address cycles 472, with the ALE signal 464 being in a HIGH logic state corresponding to a rising edge of the WE# signal 463. Data cycle(s) (not shown in FIG. 4), associated with the command and/or address(es), follow the address cycles 472 on the bus, being latched on a rising edge of the WE# signal 463. The RE# (i.e., read enable) signal 466 is in an unasserted (e.g., HIGH) logic state during the asynchronous write operation.

The signals indicated in FIG. 4 correspond to one method for implementing embodiments of the present disclosure. It will be appreciated by those ordinarily skilled in the art that changes to the particular signals communicated to/from the memory interface, as shown in FIG. 4, will not depart from the scope of the present disclosure.

Address information communicated during the address cycles 472, and latched in address register 344 is further directed to a column decode 350 and/or a row decode 352, which in turn, drives selection of one or more memory cells of memory 304. Data I/O information is written to/read from memory 304 through a cache register 354 and data register 356. Control logic 320 loads status information into a status register 358, which may be further communicated to I/O control 318. Wear cycle/state information communicated during the address cycles 472, or command cycles 471, may be latched in block age register 345, and further directed to control logic 320.

Memory cell operational performance changes as the quantity of program/erase cycles increase. The reader will appreciate that certain performance characteristics and changes thereto, may be accommodated with adjustments made to one or more operating parameters (e.g., voltages, durations, pulse quantities, etc.) associated with programming for an array of non-volatile memory cells (e.g., array 100) as a means for extending its useful life. According to one or more embodiments of the present invention, memory cell operating parameters are determined in response to wear cycle information and/or wear state information received by the memory device 303 from the memory access device (e.g., 205 in FIG. 2).

Determining (e.g., selection, setting, adjustment, etc.) can include measures to counteract degradation, and/or to adapt to new performance characteristics more suitable to memory cells of a given age. For example, the quantity of erase pulses used to place memory cells in an erased state can be increased in response to slower erase operations based on age, or programming voltages can be adjusted to accommodate programming performance changes as memory cells age. Further discussion of memory cell operational performance is provided in co-pending, co-assigned U.S. patent application Ser. No. 11/414,966, entitled, "Memory Voltage Cycle Adjustment", filed on May 1, 2006, and co-pending, co-assigned U.S. patent application Ser. No. 11/876,406, entitled, "Memory Cell Operation", filed on Oct. 22, 2007, each having common inventorship.

FIG. 5A is a table illustrating an address data arrangement organized into 5 cycles, in accordance with one or more embodiments of the present disclosure. The data arrangement shown in FIG. 5A, includes information transmitted during the address cycles (e.g., 472 in FIG. 4) arranged into five (5) 8-bit portions (e.g., five address cycles). The data arrangement shown in FIG. 5A may be communicated across an 8-bit bus using five address cycles. Embodiments of the present disclosure are not limited to this configuration, and may be arranged to have a different word length (e.g., 16 bits), including more or less bits per word so as to comprise more or fewer address cycles.

The data arrangement shown in FIG. 5A is configured for compatibility with legacy read, program (e.g., write, erase) commands, and includes a number of unused bits (shown set LOW in FIG. 5A). According to one or more embodiments of the present disclosure, one or more of the otherwise unused bits of the address cycles are used to represent age information (e.g., wear cycle information, wear state information) corresponding to the memory cell(s) being addressed within the address cycles. According to one or more embodiments of the present disclosure, wear cycle and/or wear state information, are included in the address cycle communicated last in time; however, embodiments of the present disclosure are not so limited. The address cycle communicated last in time may (as shown in FIG. 5A), or may not (as shown in FIG. 5B), include a portion of the address-identifying information for the portion of the memory cells to which the command set applies.

According to one or more embodiments of the present disclosure, wear cycle and/or wear state information, are included in the command cycle communicated last in time; however, embodiments of the present disclosure are not so limited. The command cycle communicated last in time may, or may not, include a portion of the command-identifying information for the portion of the memory cells to which the command set applies.

For example, and as shown in FIG. 5A, the three upper, i.e., most-significant, available bits of the fifth address cycle may be used to convey age information (e.g., by representing a wear cycle quantity, a wear state determined from wear cycle quantity, one or more age-related status flags, other information that represents to the memory device a performance-related age classification).

By including age information within a legacy-compatible quantity of address cycles (or command cycles), using otherwise unused or available bits within a pre-existing quantity of address cycles (or command cycles), additional memory functionality may be added while retaining compatibility with a legacy system, software, and/or communication protocol. While 3 bits are shown in FIG. 5A being used to represent the age information of the one or more memory cells (e.g., a block) embodiments of the present disclosure are not so limited. That is, embodiments of the data arrangement of the present disclosure may utilize more or fewer bits to represent a memory cell age that corresponds to the memory cells being accessed (e.g., written to, read from, erased, etc.) For example, one bit may be used to indicate one of two wear states, which may be used to toggle the memory device therebetween.

The address cycles (or command cycles) containing age information are received from the memory access device (e.g., 205 in FIG. 2) by the I/O control (e.g., 318 in FIG. 3) of the memory device (e.g., 303 in FIG. 3). The age information (e.g., wear cycle/state information) can be extracted from the address cycles, latched into the block age register (e.g., 345 in FIG. 3) and further communicated to the control logic (e.g., 320 in FIG. 3) for use as previously described.

The control logic (e.g., 320 in FIG. 3) can be programmed so as to relate wear cycle/state information pertaining to the memory cells being operated (e.g., some portion of memory array such as 304 in FIG. 3) and the performance characterization of the memory cells as a function of wear cycle/state information. For example, the control logic (e.g., 320 in FIG. 3) may be configured to (e.g., programmed) operate responsive to memory cell performance changes due to age, such as the drift in Vt. According to one or more embodiments of the present disclosure, control logic (e.g., 320 in FIG. 3) may be configured to determine one or more operating parameters for the portion of the memory cells, at least partially in response to wear cycle/state information received. For example, at least one operating parameter may be determined based at least partially on wear cycle/state information and a predetermined Vt drift curve information stored in the memory device, the Vt drift curve information characterizing the performance of the memory cells as a function of age (e.g., wear cycle, wear state).

A memory device of the same type, or manufacture, as the memory device being operated may be tested to determine age related performance characteristics. For example, a Vt drift curve versus wear cycles may be ascertained from testing Vt levels as a function of wear cycles. Measurements may be taken to determine performance characteristics versus age for different memory types, sizes, manufacture, or other configurations. Then, a similar memory device may be programmed with the performance characteristics versus age (e.g., wear cycle, wear state) in a manner that allows the memory device to determine one or more operating parameters based on age information received from a memory access device. For example, Vt drift data for a NAND flash memory device may be characterized, and embedded into the NAND memory device. This data may be arranged in a data arrangement such as a data table, or may be implemented by execution of a stored function or computation, or may be implemented in firmware, for determining the operational parameter using an age-related input (e.g., wear cycle, wear state).

The wear cycle/state information may be communicated to the NAND device controller (e.g., I/O control such as 318 in FIG. 3) and/or control logic (e.g., 320 in FIG. 3) as part of access information (e.g., command and/or address data) transferred to the NAND device during command and/or address cycles. Thereafter, given the wear cycle/state, information, control logic (e.g., 320 in FIG. 3) is configured to determine (e.g., select, set, adjust) one or more operating parameters for the portion of memory cells being operated. In this manner, a NAND flash memory device control logic (e.g., 320 in FIG. 3) may apply appropriate read, program (e.g., write, erase) timing, duration or magnitude, based on a block age (e.g., wear cycle information, wear state information) to improve performance and durability.

As previously mentioned, a memory access device (e.g., 205 in FIG. 2) may determine (e.g., count, track, record) wear cycles for each given portion of memory. According to one or more embodiments of the present disclosure, solid state drive (SSD) may be configured to have firmware, or a processor executing software, to implement keeping track of erase counts for each NAND device block. Thereafter, the erase counts are communicated (e.g., as wear cycle information, wear state information) for each read, program and/or erase operation to the memory device. Embodiments are not limited to being implemented for block-size units of memory, and may be implemented for individual memory cells, or any quantity thereof.

As a memory device ages, controlled read, write and erase timing and voltages can contribute to a prolonged life, since application of certain voltage magnitudes and/or pulse quantities or frequencies tend to affect the amount of trapped charge for example. If memory cell error rates are reduced, and/or program and erase operations accomplished more quickly, less processor time is spent in error handling and other repetitive actions. Performance improvements may be attained by adjusting read, program (including erase) times corresponding to block age (e.g., shortening when young, lengthening when old) to accommodate the actual performance changes occurring in the memory device.

Wear cycle/state information may also be used to switch a memory device between a safe (e.g., high reliability) operating mode and a fast (e.g., high speed) operating mode. According to one or more embodiments, the safe operating mode operates with more reliability but at a slower speed relative to the high performance operating mode, and the high performance operating mode operates with faster speed but with less reliability relative to the safe operating mode. For example, one or more operating parameters associated with a "safe" wear state may be determined and stored in the memory device. Then by receiving wear state information corresponding to the "safe" wear state, the memory control logic may determine operating parameter(s) in operating the memory cells being accessed (e.g., for read, program, erase operations). One skilled in the art will appreciate that in this manner certain areas of a memory device may be operated according to safe operating parameters (e.g., if a safe wear state always accompanies operations to that area of the memory device regardless of age).

Upon receiving age information, the control logic (e.g., 320 in FIG. 3) can determine operating parameters (e.g., Vt drift) corresponding to the age information received. If no age information is received during the address cycles, the control logic (e.g., 320 in FIG. 3) may utilize default operating parameters to operate the memory cells. Conversely, if age information is sent by the memory access device (e.g., 205 in FIG. 2) but the control logic (e.g., 320 in FIG. 3) does not include such age compensation functionality, or is unable to comprehend or properly apply such age information, then the age information included in that address cycles may be ignored. In this manner, techniques of the present disclosure may retain compatibility with legacy devices and methods that do not include certain age compensation functionality.

One skilled in the art will appreciate the advantages, and limitations, in using available (e.g., otherwise unused) bits of an established quantity of address cycles. The upper (e.g., most significant) bits of address cycle five may be ignored if the memory device does not support the wear cycle/state functionality.

FIG. 5B is a table illustrating another address data arrangement organized into 6 cycles, in accordance with one or more embodiments of the present. disclosure. The data arrangement shown in FIG. 5B is similar to the data arrangement shown in FIG. 5A; however, several changes as described below are included. First, the most-significant bits of the fifth address cycle are not used to represent wear cycle/state information. Instead, the most-significant bits of the fifth address cycle remain unused (e.g., set LOW) and a sixth address cycle is added containing wear cycle information and/or wear state information. For example, the four most-significant bits of the sixth (additional) address cycle may be used to communicate the age of the memory block being referenced by the address (es) communicated in the first five address cycles.

A data arrangement, according to one or more embodiments of the present disclosure, includes a first quantity of bits representing addressing information corresponding to a portion of a memory device, and a second quantity of bits representing wear cycle/state information corresponding to the portion of a memory device. The first and second quantity of bits are communicated in N address cycles, which are communicated from a memory access device to the memory device. According to one or more embodiments, the last (i.e., Nth) address cycle includes the second quantity of bits.

According to one or more embodiments, the second quantity of bits may be arranged as the one or more most significant bits of the Nth address cycle. However, embodiments of the present disclosure are not so limited, and wear cycle/state information need not be exclusively confined to the most significant bits. For example, one bit may be used to represent an age flag, and this bit may be communicated in the last address cycle by other than the most significant bit of the address cycle. So too, may age information (e.g., a flag) be communicated by a bit of an address cycle other than the last address cycle.

As the reader will appreciate, the second quantity of bits may be contained in the last address cycle, with or without, any bits of the first quantity of bits. That is, the second quantity of bits may be contained in the last address cycle along with (shown in FIG. 5A), or without (shown in FIG. 5B), a portion of the first quantity of bits.

One skilled in the art will appreciate that some memory devices utilize 3 or 5 address cycles in addressing memory cells. One skilled in the art will also appreciate the benefit in maintaining compatibility with this 3 or 5 address cycle protocol by including the wear cycle information and/or wear state information in the existing 3 or 5 address cycles (e.g., by making use of the otherwise unused data bits). So too, will one skilled in the art appreciate the benefit in including the wear cycle information and/or wear state information in an additional address cycle (e.g., thus allowing more bits in the 3 or 5 address cycles to be used for addressing information). As previously mentioned, wear cycle information and/or wear state information is not limited to inclusion in address cycles, and may be included in existing, or additional, command cycles, as appropriate with system compatibility considerations.

Figure 6:
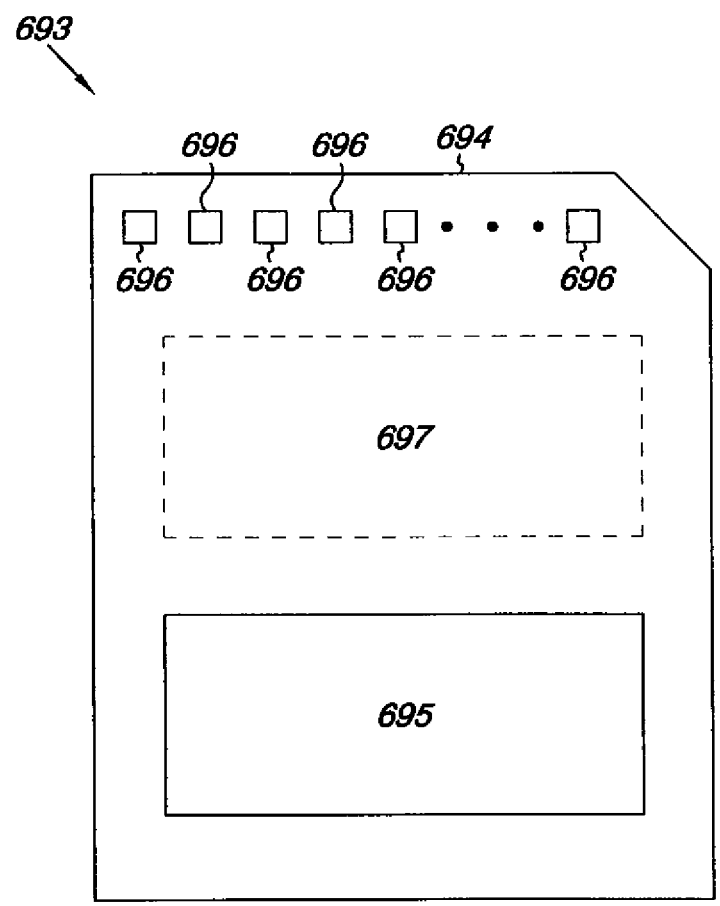
FIG. 6 is a functional block diagram of a memory module having at least one memory device in accordance with one or more embodiments of the present disclosure.

FIG. 6 is a functional block diagram of a memory module having at least one memory device operated in accordance with one or more embodiments of the present disclosure. Memory module 693 is illustrated as a memory card, although the concepts discussed with reference to memory module 693 are applicable to other types of removable or portable memory (e.g., USB flash drives) and are intended to be within the scope of "memory module" as used herein. In addition, although one example form factor is depicted in FIG. 6, these concepts are applicable to other form factors as well.

In one or more embodiments, memory module 693 will include a housing 694 (as depicted) to enclose one or more memory devices 695, though such a housing is not essential to all devices or device applications. At least one memory device 695 includes an array of non-volatile multilevel memory cells that can be sensed according to embodiments described herein. Where present, the housing 694 includes one or more contacts 696 for communication with a host device. Examples of host devices include digital cameras, digital recording and playback devices, PDAs, personal computers, memory card readers, interface hubs and the like. For one or more embodiments, the contacts 696 are in the form of a standardized interface. For example, with a USB flash drive, the contacts 696 might be in the form of a USB Type-A male connector. For one or more embodiments, the contacts 696 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 696 provide an interface for passing control, address and/or data signals between the memory module 693 and a host having compatible receptors for the contacts 696.

The memory module 693 may optionally include additional circuitry 697, which may be one or more integrated circuits and/or discrete components. For one or more embodiments, the additional circuitry 697 may include control circuitry, such as a memory controller, for controlling access across multiple memory devices 695 and/or for providing a translation layer between an external host and a memory device 695. For example, there may not be a one-to-one correspondence between the number of contacts 696 and a number of 695 connections to the one or more memory devices 695. Thus, a memory controller could selectively couple an I/O connection (not shown in FIG. 6) of a memory device 695 to receive the appropriate signal at the appropriate I/O connection at the appropriate time or to provide the appropriate signal at the appropriate contact 696 at the appropriate time. Similarly, the communication protocol between a host and the memory module 693 may be different than what is required for access of a memory device 695. A memory controller could then translate the command sequences received from a host into the appropriate command sequences to achieve the intended access to the memory device 695. Such translation may further include changes in signal voltage levels in addition to command sequences.

The additional circuitry 697 may further include functionality unrelated to control of a memory device 695 such as logic functions as might be performed by an ASIC. Also, the additional circuitry 697 may include circuitry to restrict read or write access to the memory module 693, such as password protection, biometrics or the like. The additional circuitry 697 may include circuitry to indicate a status of the memory module 693. For example, the additional circuitry 697 may include functionality to determine whether power is being supplied to the memory module 693 and whether the memory module 693 is currently being accessed, and to display an indication of its status, such as a solid light while powered and a flashing light while being accessed. The additional circuitry 697 may further include passive devices, such as decoupling capacitors to help regulate power requirements within the memory module 693.

CONCLUSION

The present disclosure includes memory devices and systems having memory cells, as well as methods for operating the memory cells. One or more methods for operating memory cells includes determining age information for a portion of the memory cells and communicating a command set for the portion of the memory cells, the command set including the age information.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory cells of a memory device, comprising:
   receiving, by the memory device, a wear state for the memory cells from a memory access device;
   determining, by the memory device, a set of operating parameters for the memory cells responsive to the received wear state,
   wherein the wear state corresponds to a quantity of erase pulses used to accomplish a verified erasure of the memory cells.

2. The method of claim 1, wherein receiving the wear state includes receiving the wear state from available bits within a pre-existing legacy-compatible quantity of address cycles.

3. The method of claim 1, wherein receiving the wear state includes receiving wear cycle information from available bits within a pre-existing legacy-compatible quantity of address cycles.

4. The method of claim 1, wherein receiving the wear state includes receiving the wear state from available bits within a pre-existing legacy-compatible quantity of command cycles.

5. The method of claim 1, wherein receiving the wear state includes receiving wear cycle information from available bits within a pre-existing legacy-compatible quantity of command cycles.

6. The method of claim 1, the determined set of operating parameters causes the memory cells to expend useful life at a different rate.

7. The method of claim 1, wherein determining the set of operating parameters includes determining at least one of a programming pulse voltage magnitude, a programming pulse duration, a programming pulse frequency, and a quantity of programming pulses.

8. A method for operating memory cells of a memory device, comprising:
   determining, by a memory access device, a wear state for the memory cells; and
   communicating the wear state from the memory access device to the memory device; and
   determining, by the memory device, a set of operating parameters for the memory cells in response to the determined wear state,
   wherein determining the wear state for the memory cells includes evaluating characteristics of the memory device corresponding to the wear state, and
   wherein evaluating characteristics of the memory device corresponding to the wear state includes measuring a quantity of erase pulses used to accomplish a verified erasure of the memory cells.

9. The method of claim 8, wherein communicating the wear state includes providing a quantity of wear cycles to the memory device with each read operation.

10. The method of claim 8, wherein communicating the wear state includes providing a quantity of wear cycles to the memory device with each program operation.

11. The method of claim 8, wherein communicating the wear state includes providing a quantity of wear cycles to the memory device with each erase operation.

12. The method of claim 8, further comprising compensating for memory device performance changes corresponding to the wear state.

13. A method for operating memory cells of a memory device, comprising:
   determining, by a memory access device, a wear state for the memory cells; and
   communicating the wear state from the memory access device to the memory device; and
   determining, by the memory device, a set of operating parameters for the memory cells in response to the determined wear state,
   wherein communicating the wear state from the memory access device to the memory device includes using available bits within a pre-existing legacy-compatible quantity of address cycles to communicate the wear state and/or wear cycle information.

14. A method for operating memory cells of a memory device, comprising:
   determining, by a memory access device, a wear state for the memory cells; and
   communicating the wear state from the memory access device to the memory device; and
   determining, by the memory device, a set of operating parameters for the memory cells in response to the determined wear state,
   wherein communicating the wear state from the memory access device to the memory device includes using available bits within a pre-existing legacy-compatible quantity of command cycles to communicate the wear state and/or wear cycle information.

15. A memory device, comprising:
   an array of memory cells; and
   control circuitry coupled to the array, and adapted to:
      receive a wear state for the memory cells from a memory access device; and
      determine at least one operating parameter for the memory cells in response to the received wear state,
      wherein the wear state corresponds to a quantity of erase pulses used to accomplish a verified erasure of the memory cells.

16. The method of claim 15, wherein the control circuitry is further adapted to determine the at least one operating parameter so as to minimize an expected Vt drift for a particular wear state of the memory cells.

17. The memory device of claim 15, wherein the control circuitry is further adapted to implement slower speed operation of the memory cells responsive to the received wear state.

18. The memory device of claim 15, wherein the control circuitry is further adapted to implement higher reliability operation of the memory cells responsive to the received wear state.

19. The memory device of claim 15, wherein the control circuitry is further adapted to change at least one operating parameter for the memory cells in response to the received wear state.

20. The memory device of claim 15, wherein the control circuitry is further adapted to compensate for memory device performance changes corresponding to the received wear state.

* * * * *